United States Patent [19]

Seki et al.

[11] 4,275,430

[45] Jun. 23, 1981

[54] DV/DT PROTECTION CIRCUIT DEVICE FOR GATE TURN-OFF THYRISTOR

[75] Inventors: Nagataka Seki, Fuchu; Yukio Watanabe, Ikou, both of Japan

[73] Assignee: Tokyo Shibaura Electric Co., Ltd., Kawasaki, Japan

[21] Appl. No.: 863,047

[22] Filed: Dec. 21, 1977

[30] Foreign Application Priority Data

Dec. 25, 1976 [JP] Japan .................................. 51-156945

[51] Int. Cl.³ ............................................. H02H 7/10
[52] U.S. Cl. ....................................... 361/91; 361/58;
363/50; 363/54; 363/57
[58] Field of Search ..................... 361/91, 88, 58, 100,
361/4, 93; 307/252 C; 363/50, 54, 57, 58

[56] References Cited

U.S. PATENT DOCUMENTS

| 3,353,032 | 11/1967 | Morgan et al. | 307/252 C |
|---|---|---|---|
| 3,462,754 | 8/1969 | Kelley | 361/100 X |
| 3,524,990 | 8/1970 | Bajpai et al. | 363/50 X |
| 3,532,901 | 10/1970 | Cavallius et al. | 361/91 X |
| 3,943,430 | 3/1976 | Kumano | 307/252 C X |
| 4,016,433 | 4/1977 | Brooks | 307/252 C |

Primary Examiner—Patrick R. Salce
Attorney, Agent, or Firm—Oblon, Fisher, Spivak, McClelland & Maier

[57] ABSTRACT

A snubber circuit is connected between the anode and cathode of a gate turn-off (GTO) thyristor. To the GTO thyristor a saturable reactor is connected in series. A gate off signal is supplied to the gate of the GTO thyristor and to the saturable reactor as backward current to reset the saturable reactor.

1 Claim, 5 Drawing Figures

DV/DT PROTECTION CIRCUIT DEVICE FOR GATE TURN-OFF THYRISTOR

BACKGROUND OF THE INVENTION

This invention relates to a dv/dt protection circuit for a thyristor, particularly for a gate turn-off (GTO) thyristor.

GTO thyristors of a small capacity are known. Recently it became possible to manufacture GTO thyristors of large capacity, as large as 200A to 600A. GTO thyristors are used as various power converting devices such as inverters. GTO thyristors of small capacity have been used in apparatus of small capacity such as control devices. They could not be and were not used in apparatus of large capacity and no difficult problems arose. Recently GTO thyristors of large capacity have been invented. If they are used in a converter circuit, problems arise which cannot be easily solved by any known technique. One such problem is concerned with dv/dt protection circuits.

dv/dt is an abrupt positive voltage change between the anode and cathode of a GTO thyristor. When dv/dt surpasses a value specific to the GTO thyristor, the GTO thyristor is inevitably turned on. This limit value is called critical rate of rise of off-state voltage. A GTO thyristor has a lower critical rate of rise of off-state voltage than that of an ordinary thyristor. Thus it is necessary to take measures to protect against dv/dt of a GTO thyristor.

It will now be described how dv/dt protection has been effected conventionally in, for example, an inverter constituted by four GTO thyristors. Between first and second GTO thyristors a first reactor is connected, and between third and fourth GTO thyristors a second reactor is connected. A load is connected between the neutral terminals of the first and second reactors. The first and second GTO thyristors constitute a series circuit, and the third and fourth GTO thyristors another series circuit. Between these series circuits there is connected a DC power source. Namely, the four GTO thyristors are bridge-connected to one another through the first and second reactors. To each GTO thyristor there is connected a snubber circuit.

In this inverter, the snubber circuits and the reactors constitute a dv/dt protection circuit. The reactors work just as a current back flow circuit which an ordinary thyristor circuit requires. As a result, the self-arc-extinguishing ability of each GTO thyristor cannot be fully utilized. Further, when the first GTO thyristor being ignited is turned off, current stops flowing in the first reactor, whereby a high voltage is produced on the first reactor. The high voltage is then applied between the anode and cathode for the first GTO thyristor. Consequently, the first GTO thyristor is erroneously turned on again.

To avoid such a mishap, the capacitance of a capacitor in the snubber circuit connected to the first GTO thyristor should be made sufficiently large, or the second GTO thyristor should be turned on before the first GTO thyristor is turned off so that the current flowing in a first coil portion of the first reactor between the first GTO thyristor and the neutral terminal of the first reactor is made to flow into a second coil portion of the first reactor between the second GTO thyristor and the neutral terminal of the first reactor. This method, however, inevitably diminishes the electric characteristics of the GTO thyristors, and the GTO thyristors cannot fully achieve their high speed make-and-break operation.

SUMMARY OF THE INVENTION

Accordingly, an object of this invention is to provide a dv/dt protection circuit which suppresses dv/dt of a GTO thyristor, without diminishing the electric characteristics of the GTO thyristor.

A dv/dt protection circuit for a GTO thyristor according to this invention comprises a saturable reactor connected to a GTO thyristor, a gate turn-off signal source connected between the gate and anode of the GTO thyristor through the saturable reactor to apply a gate turn-off signal to the gate of the GTO thyristor and the saturable reactor as backward current to reset the same, and a snubber circuit connected between the anode and cathode of the GTO thyristor.

BRIEF DESCRIPTION OF THE DRAWINGS

This invention can be more fully understood from the following detailed description when taken in conjunction with the accompanying drawings, in which.

DESCRIPTION OF THE PREFERRED EMBODIMENTS

Figure 1:
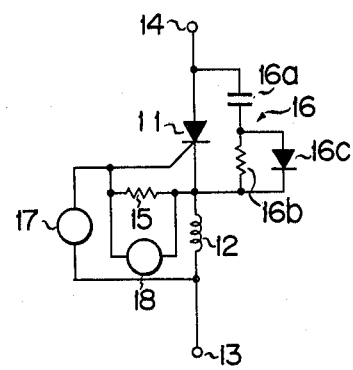
FIG. 1 is a circuit diagram of a dv/dt protection circuit according to this invention.

In the circuit shown in FIG. 1, a gate turn-off (GTO) thyristor 11 has its cathode connected to a load terminal 13 via a saturable reactor 12. The anode of the GTO thyristor 11 is connected to, for example, a DC power source 14. Between the gate and cathode of the GTO thyristor 11 there is connected a resistor 15. Further, a snubber circuit 16 is connected between the anode and cathode of the GTO thyristor 11. The snubber circuit 16 is constituted by a capacitor 16a, a resistor 16b connected in series to the capacitor 16a, and a diode 16c connected in parallel to the resistor 16b. A gate turn-off signal source 17 is connected between the gate of the GTO thyristor 11 and the contact point between the saturable reactor 12 and the load terminal 13, thereby to supply a gate turn-off signal to the gate of the GTO thyristor 11. Between the gate and cathode of the GTO thyristor 11 there is connected a gate turn-on signal source 18 which supplies a gate turn-on signal to the gate of the GTO thyristor 11.

Figure 2:
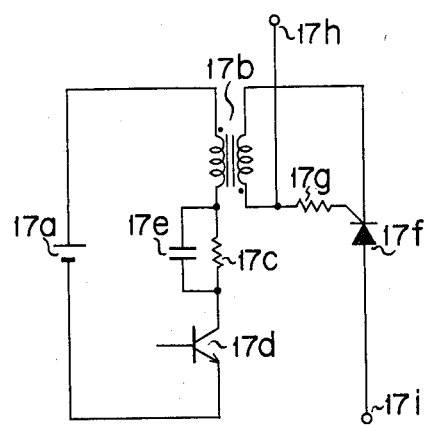
FIG. 2 is a circuit diagram of a gate turn-off signal source.

The gate turn-off signal source 17 is constituted as shown in FIG. 2. Namely, a DC power source 17a is connected to a series circuit which is constituted by a pulse transformer 17b, a resistor 17c and an NPN transistor 17d. A capacitor 17e is connected in parallel to the resistor 17c so as to improve the rise of current flowing in the series circuit. The negative terminal of the secondary winding of the pulse transformer 17b is connected to the cathode of a thyristor 17f. Another resistor 17g is connected between the gate of the thyristor 17f and the positive terminal of the secondary winding of the pulse transformer 17b. A terminal 17h is connected to the contact point between the resistor 17g and the positive terminal of the secondary winding of the transformer 17b, and is connected to the gate of the GTO thyristor 11 shown in FIG. 1. Further, a terminal 17i is connected to the anode of the thyristor 17f and to the contact point between the saturable reactor 12 and the load terminal 13 both shown in FIG. 1.

In such a turn-off signal source 17, the NPN transistor 17d is turned on when a control signal is supplied to the base of the transistor 17d. Then, a voltage is induced in the secondary winding of the pulse transformer 17b in the direction as indicated by a dot. Thus the thyristor 17f is turned on, and thus the voltage is generated between the terminals 17h and 17i. In this case, the terminal 17h becomes a negative one, and the terminal 17i a positive one. The thyristor 17f is to prevent the turn-on signal source 18 from being short-circuited by the secondary winding of the pulse transformer 17b.

The gate turn-on signal source 18 is substantially identical in construction with a gate turn-on signal source for an ordinary thyristor. For this reason, it is not described here how the turn-on signal source 18 is constructed.

When the GTO thyristor 11 is turned off by a gate turn-off signal from the gate turn-off signal source 17, while being turned on, a positive dv/dt is applied between the load terminal 13 and the DC power source terminal 14. Positive dv/dt is proportional to $1/\sqrt{LC}$, where L and C denote the inductance of the reactor 12 and the capacitance of the capacitor 16a, respectively. Thus it is sufficient to use a reactor having a large inductance L in order to reduce dv/dt. The reactor 12 is a saturable reactor which acts as a reactor for so short a time as about 10 microseconds the moment the GTO thyristor 11 is turned on or off. It does not affect at all the normal operation characteristics of the device, e.g. converter circuit.

In the thyristor technology it is well known to connect a saturable reactor in series to the thyristor in such a manner as mentioned above. But a saturable reactor may fail to be reset or made non-saturable since a GTO thyristor has a small reverse recovery current. This would not happen in the circuit shown in FIG. 1 because the reactor 12 is reset without fail, since the saturable reactor 12 is connected to the cathode of the GTO thyristor 11 and a gate turn-off current flows in the opposite direction in the saturable reactor 12.

If the gate turn-off signal from the gate turn-off signal source 17 does not rise sharply, the GTO thyristor may not be turned off. In the circuit shown in FIG. 1, the saturable reactor 12 has been saturated when the GTO thyristor 11 is to be turned off. Thus, even if the current flowing in the saturable reactor 12 changes, the inductance L of the reactor 12 remains substantially constant. The gate turn-off signal will therefore rise sharply, and the GTO thyristor 11 is turned off unfailingly in response to the gate turn-off signal.

Figure 3:
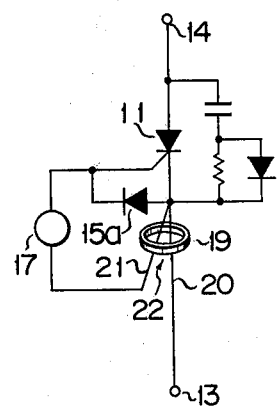
FIG. 3 is a circuit diagram of another embodiment of this invention, wherein a ring core is disposed on the cathode side of a GTO thyristor.
Figure 4:
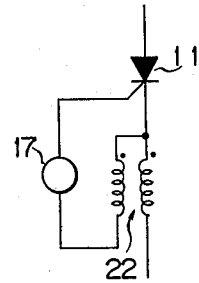
FIG. 4 shows an equivalent circuit of the dv/dt protection circuit shown in FIG. 3.

The saturable reactor 12 is constituted by a core and a coil in the circuit shown in FIG. 1. Instead, it may be constituted by such a ring core 19 as illustrated in FIG. 3. In this case, two wires 20 and 21 extend through the ring core 19. The wire 20 is connected between the cathode of the GTO thyristor 11 and the load terminal 13, and the wire 21 between the cathode of the GTO thyristor 11 and the gate turn-off signal source 17. An equivalent circuit of the saturable reactor 22 thus constituted is shown in FIG. 4. Also, a diode 15a is connected between the gate and cathode of the GTO thyristor 11. The dv/dt protection circuit shown in FIG. 3 gives forth operational effects similar to those of the circuit shown in FIG. 1.

Figure 5:
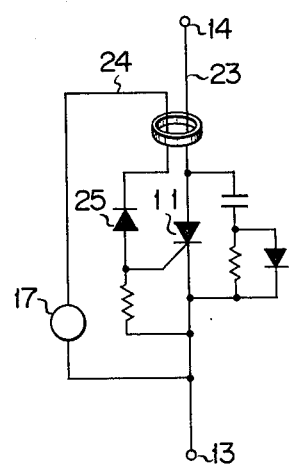
FIG. 5 is a circuit diagram of a further embodiment of this invention, wherein a ring core is disposed on the anode side of GTO thyristor.

In the circuit of FIG. 3 the saturable reactor 22 is connected to the cathode of the GTO thyristor 11. Instead, it may be connected to the anode of the GTO thyristor 11 as illustrated in FIG. 5. In this case, two wires 23 and 24 extend through the ring core 18, too. The wire 23 is connected between the anode of the GTO thyristor 11 and the DC power source 14, and the wire 24 between the gate of the GTO thyristor 11 and the gate turn-off signal source 17 through a diode 25. The dv/dt protection circuit shown in FIG. 5 results in operational effects similar to those of the circuit shown in FIG. 1.

Generally, an excessive backward voltage is applied between the gate and cathode of a GTO thyristor when the GTO thyristor is turned off. To avoid such an excessive backward voltage, a serial circuit comprised of a diode and a zener diode should be connected between the anode and cathode of the GTO thyristor. According to this invention, a zener diode need not be used, or a zener diode of a small capacity can fully help protect the GTO thyristor against an overvoltage between the gate and cathode. This is because an excessive backward voltage is applied solely on the saturable reactor 12.

Moreover, if a GTO thyristor fails to be turned off, a power loss may occur to break the GTO thyristor. Such a mishap can be avoided in this invention. Since the saturable reactor 12 has a large inductance, the current flowing in the GTO thyristor 11 does not increase quickly. Thus, only if an ignition signal is supplied to the gate of the GTO thyristor 11 before the current starts increasing, the current is dispersed in the whole surface of semiconductor regions forming the GTO thyristor 11 and is never concentrated on a limited part of the GTO thyristor 11. For this reason, the GTO thyristor 11 is not broken.

Still further, the power loss by a snubber circuit 16 can be minimized merely by reducing the capacitance of the capacitor 16a. The capacitance of the capacitor 16a can be reduced since the saturable reactor 12 has a large inductance. This means that the high frequency switching characteristic of a GTO thyristor can be utilized most effectively.

What we claim is:

1. A dv/dt protection circuit device for a gate turn-off (GTO) thyristor which has a gate, an anode and a cathode and which is turned on in response to a gate turn-on signal and turned off in response to a gate turn-off signal from a gate turn-off (GTO) signal source, said circuit device comprising:
   a snubber circuit connected in parallel with said GTO thyristor;
   a saturable reactor connected in series with said GTO thyristor and saturated by a load current flowing through said gate turn-off (GTO) thyristor and said saturable reactor; and
   means for restoring said saturable reactor to a nonsaturated condition;
   wherein said saturable reactor is constituted by a ring core, a first conductor coupled to said anode of said GTO thyristor passing through said ring core, said load current flowing through said first conductor;
   wherein said restoring means includes a second conductor passing through said ring core, said second conductor coupling said gate of said GTO thyristor to said gate turn-off signal source; and wherein a gate turn-off current from said gate turn-off signal source flowing in said second conductor produces a magnetic flux in said ring core which opposes the magnetic flux produced in said ring core by said load current flowing said first conductor;

whereby said circuit device controls the dv/dt applied to said GTO thyristor at the time of turn-off.

* * * * *